(12) United States Patent
Robinson et al.

(10) Patent No.: US 8,318,289 B2
(45) Date of Patent: *Nov. 27, 2012

(54) COATED POLYMERIC SUBSTRATES HAVING IMPROVED SURFACE SMOOTHNESS SUITABLE FOR USE IN FLEXIBLE ELECTRONIC AND OPTO-ELECTRONIC DEVICES

(75) Inventors: Julian Neal Robinson, North Yorkshire (GB); Robert William Eveson, Cleveland (GB); Karl Rakos, Durham (GB)

(73) Assignee: DuPont Teijin Films U.S. Limited Partnership, Chester, VA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/640,826

(22) Filed: Dec. 17, 2009

(65) Prior Publication Data
US 2010/0159198 A1 Jun. 24, 2010

Related U.S. Application Data

(62) Division of application No. 10/510,084, filed on Jun. 6, 2005, now Pat. No. 7,641,957.

(30) Foreign Application Priority Data

Apr. 12, 2002 (GB) .................................. 0208506.6

(51) Int. Cl.
*B32B 27/06* (2006.01)
*B32B 27/18* (2006.01)
*B32B 27/28* (2006.01)
*B32B 27/36* (2006.01)

(52) U.S. Cl. ........ 428/141; 428/36.6; 428/332; 428/339; 428/446; 428/447; 428/480; 428/910

(58) Field of Classification Search ........................ None
See application file for complete search history.

(56) References Cited

U.S. PATENT DOCUMENTS
3,443,950 A 5/1969 Rawlins, Jr.
(Continued)

FOREIGN PATENT DOCUMENTS
EP 0408197 1/1991
(Continued)

OTHER PUBLICATIONS
International Search Report mailed Jul. 25, 2003.
(Continued)

*Primary Examiner* — Vivian Chen
(74) *Attorney, Agent, or Firm* — RatnerPrestia

(57) ABSTRACT

A composite film comprising a heat-stabilised, heat-set, oriented poly(ethylene naphthalate) substrate, and a coating layer having a surface; wherein said substrate exhibits one or more of:
(i) a shrinkage at 30 mins at 230° C. of less than 1%; and/or
(ii) a residual dimensional change $\Delta L_r$ measured at 25° C. before and after heating the substrate from 8° C. to 200° C. and then cooling to 8° C., of less than 0.75% of the original dimension; and/or
(iii) a coefficient of linear thermal expansion (CLTE) within the temperature range from −40° C. to +100° C. of less than $40 \times 10^{-6}/°$ C.;
and wherein the surface of said coating layer exhibits an Ra value of less than 0.6 nm, and/or an Rq value of less than 0.8 nm, the thickness of the substrate is between 50 and 250 μm and wherein the number of surface peaks in the range 300 to 600 nm per 5 cm² area (N(300-600)) of the film is less than 50.

15 Claims, 1 Drawing Sheet

U.S. PATENT DOCUMENTS

| | | | |
|---|---|---|---|
| 3,875,119 A | 4/1975 | Aoki et al. | |
| 3,986,997 A | 10/1976 | Clark | |
| 4,042,539 A | 8/1977 | Fanning | |
| 4,141,735 A | 2/1979 | Schrader et al. | |
| 4,177,315 A | 12/1979 | Ubersax | |
| 4,348,446 A * | 9/1982 | Mitsuishi et al. | 428/148 |
| 4,394,442 A | 7/1983 | Miller | |
| 4,493,872 A * | 1/1985 | Funderburk et al. | 428/332 |
| 4,720,432 A | 1/1988 | VanSlyke et al. | |
| 4,732,814 A * | 3/1988 | Hatada et al. | 428/480 |
| 4,786,560 A * | 11/1988 | Crocker | 428/500 |
| 5,069,942 A | 12/1991 | Anderson | |
| 5,087,526 A | 2/1992 | Tomitaka et al. | |
| 5,178,962 A * | 1/1993 | Miyamoto et al. | 428/463 |
| 5,286,534 A | 2/1994 | Kohler et al. | |
| 5,379,180 A | 1/1995 | Kinoshita | |
| 5,415,942 A | 5/1995 | Anderson | |
| 5,510,168 A | 4/1996 | Mori et al. | |
| 5,512,664 A * | 4/1996 | Lee et al. | 534/799 |
| 5,514,466 A | 5/1996 | Yamada et al. | |
| 5,858,490 A | 1/1999 | Mori et al. | |
| 5,885,501 A | 3/1999 | Gardner et al. | |
| 5,942,089 A * | 8/1999 | Sproul et al. | 204/192.13 |
| 5,942,320 A * | 8/1999 | Miyake et al. | 428/216 |
| 5,968,871 A * | 10/1999 | Katashima et al. | 503/227 |
| 5,972,516 A | 10/1999 | Kaneko et al. | |
| 6,198,217 B1 | 3/2001 | Suzuki et al. | |
| 6,242,077 B1 | 6/2001 | Tojo et al. | |
| 6,303,228 B1 * | 10/2001 | Watanabe et al. | 428/423.7 |
| 6,322,860 B1 | 11/2001 | Stein et al. | |
| 6,333,117 B1 | 12/2001 | Sumi et al. | |
| 6,379,774 B1 | 4/2002 | Tojo et al. | |
| 6,419,987 B1 | 7/2002 | Bauer et al. | |
| 6,465,108 B1 | 10/2002 | Kamitani et al. | |
| 6,511,753 B1 | 1/2003 | Teranishi et al. | |
| 6,743,520 B2 | 6/2004 | Street et al. | |
| 6,936,331 B2 | 8/2005 | Ono et al. | |
| 7,641,957 B2 * | 1/2010 | Robinson et al. | 428/141 |
| 2004/0241456 A1 | 12/2004 | Yamaki et al. | |
| 2008/0193747 A1 | 8/2008 | MacDonald et al. | |
| 2010/0154886 A1 * | 6/2010 | Robinson et al. | 136/256 |
| 2010/0159198 A1 | 6/2010 | Robinson et al. | |
| 2011/0100454 A1 * | 5/2011 | Adam et al. | 136/256 |
| 2011/0209901 A1 * | 9/2011 | MacDonald et al. | 174/254 |

FOREIGN PATENT DOCUMENTS

| | | | |
|---|---|---|---|
| EP | 0419400 | | 3/1991 |
| EP | 0429179 | | 5/1991 |
| EP | 0 502 479 | * | 3/1992 |
| EP | 1 195 748 | | 4/2002 |
| GB | 838708 | | 6/1960 |
| GB | 2288184 | | 10/1995 |
| JP | 2001006157 | | 1/2001 |
| WO | WO 94/13467 | | 6/1994 |
| WO | WO03/022575 | | 3/2003 |
| WO | WO 2004/016417 A2 | | 2/2004 |

OTHER PUBLICATIONS

Schimtz, Peter et al., "Films." Ullmann's Encyclopedia of Industrial Chemistry, 5th Ed., vol. A11 (1988), pp. 85-110.

Japanese Office Action dated Sep. 3, 2012 and translation, 5 pgs.

* cited by examiner

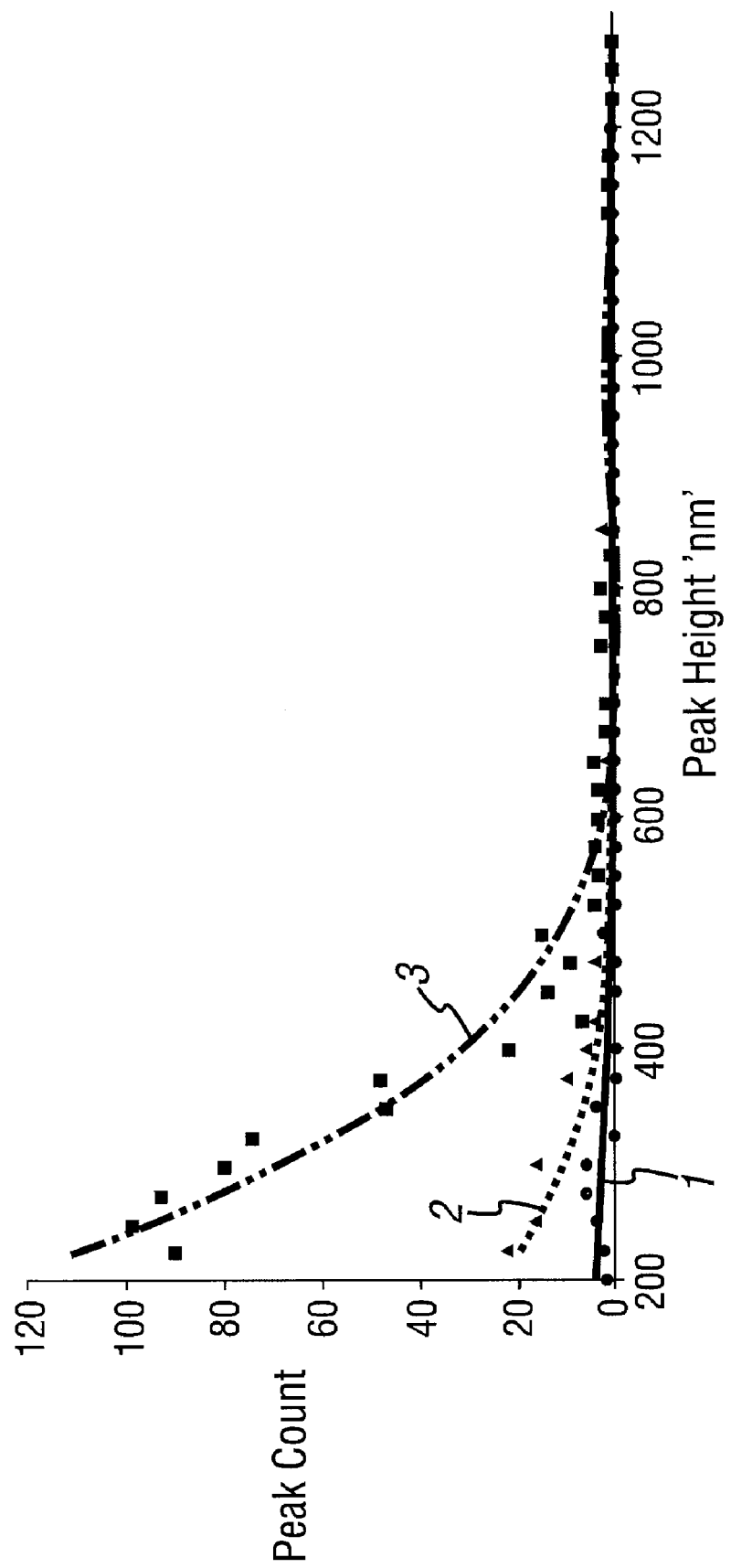

COATED POLYMERIC SUBSTRATES HAVING IMPROVED SURFACE SMOOTHNESS SUITABLE FOR USE IN FLEXIBLE ELECTRONIC AND OPTO-ELECTRONIC DEVICES

CROSS REFERENCE TO RELATED APPLICATIONS

This application is a Division of U.S. application Ser. No. 10/510,084, filed Jun. 6, 2005, now U.S. Pat. No. 7,641,957 which is a National Stage filing of PCT Application No. GB03/01170, filed Mar. 19, 2003, and claims priority of GB Application No. 0208506.6, filed Apr. 12, 2002, the disclosures of all of which are incorporated herein by reference in their entirety.

FIELD OF THE INVENTION

The present invention relates to a coating composition for improving the surface smoothness of a substrate on which it is coated, particularly a polymeric substrate suitable for use as a substrate in flexible electronic and opto-electronic devices, particularly electroluminescent (EL) display devices, in particular organic light emitting display (OLED) devices.

BACKGROUND OF THE INVENTION

Electroluminescent (EL) display is a self-emitting display mode which features excellent visibility (including high brightness, high contrast, very fast response speed and wide viewing angle), an extremely thin profile and very low power consumption. The EL display device itself emits light, as do cathode ray tubes (CRT), fluorescent and plasma displays. Unlike liquid crystal displays (LCDs), there is no need for backlighting. The response speed for EL can be as fast as 1000 times that for LCD, thus making this mode particularly well suited for use with moving images. EL displays may be used in a variety of applications, including aircraft and ship controls, automobile audio equipment, calculators, mobile telephones, portable computers, instrumentation, factory monitors and electronic medical equipment. Another major application for EL displays is as a light source, particularly as backlighting for small LCD panels in order to render them easier to read in low ambient light conditions.

EL displays work by sandwiching a thin film of a phosphorescent or other electroluminescent substance between two plates each of which comprises conductive elements in a predetermined pattern, i.e. electrodes, thereby forming addressable pixels on the display. The electrodes are formed as coatings either on the electroluminescent substance or on a separate support. Where the or each electrode is intended to transmit light, the electrodes are formed as translucent or transparent coatings, for instance using transparent conductive metal oxides. Equally, the or each support may be translucent or transparent, as required. Generally, at least the anode is transparent. The support generally functions both as a base for an electrode and as an insulating layer. The substrate also provides protection against chemical and physical damage in use, storage and transportation. Glass, as well as polymeric film, has been used as the insulating support.

EL display devices have utilised a variety of cathode materials. Early investigations employed alkali metals. Other cathode materials include combinations of metals, such as brass and conductive metal oxides (e.g., indium tin oxide). A variety of single metal cathodes, such as indium, silver, tin, lead, magnesium, manganese, and aluminum, have also been used. Relatively recent discoveries in EL construction include devices wherein the organic luminescent medium consists of two very thin layers (<1.0 µm in combined thickness) separating the anode and cathode. Representative of OLED devices are those disclosed in, for instance U.S. Pat. No. 4,720,432.

When an electrical current is passed through the conductive elements, the electroluminescent material emits light. EL displays, being an emissive technology, rather than shuttering a light source as per LCD displays, are most useful in applications where high visibility in all light conditions is important.

The development of new, organic electroluminescent materials, which can produce the three primary colours with very high purity, has made possible full-colour displays with uniform levels of brightness and longevity. Polymers having such characteristics can be dissolved in solvents and processed from solution, enabling the printing of electronic devices. Conductive conjugated polymers are of particular interest. As used herein, the term "conjugated conductive polymer" refers to a polymer having pi-electron delocalisation along its backbone. Polymers of this type are reviewed by W. J. Feast in *Polymer*, Vol. 37 (22), 5017-5047, 1996. In a preferred embodiment, the conjugated conductive polymer is selected from:

(i) hydrocarbon conjugated polymers, such as polyacetylenes, polyphenylenes and poly(p-phenylene vinylenes);

(ii) conjugated heterocyclic polymers with heteroatoms in the main chain, such as polythiophenes, polypyrroles and polyanilines; and (iii) conjugated oligomers, such as oligothiophenes, oligopyrroles, oligoanilines, oligophenylenes and oligo(phenylene vinylenes), containing at least two, preferably at least three, preferably at least four, preferably at least five, more preferably 6 or more repeating sub-units.

In addition to use in EL devices, such conjugated conductive polymers have been proposed for use in a variety of other electronic and opto-electronic devices, including photovoltaic cells and semiconductor devices (such as organic field effect transistors, thin film transistors and integrated circuits generally).

SUMMARY OF THE INVENTION

The present invention concerns the insulating and supporting substrate of an electronic or opto-electronic device comprising a conjugated conductive polymer, including an EL device (particularly an OLED), a photovoltaic cell and semiconductor devices (such as organic field effect transistors, thin film transistors and integrated circuits generally). The present invention is particularly concerned with the substrate of an opto-electronic device, particularly an EL device (particularly an OLED) or a photovoltaic device, and particularly an EL device (particularly an OLED).

BRIEF DESCRIPTION OF THE DRAWING

FIG. 1 shows plots of peak count as a function of peak height for several films, demonstrating the planarising effect of compositions and methods of the invention.

DETAILED DESCRIPTION OF THE INVENTION

The substrates can be transparent, translucent or opaque, but are typically transparent. The substrates are usually required to meet stringent specifications for optical clarity, flatness and minimal birefringence. Typically, a total light transmission (TLT) of 85% over 400-800 nm coupled with a haze of less than 0.7% is desirable for displays applications. Surface smoothness and flatness are necessary to ensure the integrity of subsequently applied coatings such as the electrode conductive coating. The substrates should also have good barrier properties, i.e. high resistance to gas and solvent permeation. A substrate for use in electronic display applications suitably exhibits water vapour transmission rates of less than $10^{-6}$ g/m$^2$/day and oxygen transmission rates of less than $10^{-5}$/mL/m$^2$/day. Mechanical properties such as flexibility, impact resistance, hardness and scratch resistance are also important considerations.

Optical quality glass or quartz has previously been used in electronic display applications as substrates. These materials are able to meet the optical and flatness requirements and have good thermal and chemical resistance and barrier properties. However, these materials do not have some of the desired mechanical properties, most notably low density, flexibility and impact resistance.

In order to improve the mechanical properties, plastics materials have been proposed as replacements for glass or quartz sheet. Plastic substrates have greater flexibility and improved impact resistance, and are of lighter weight than glass or quartz sheets of equal thickness. In addition, a flexible plastic substrate would allow the printing of electronic devices, for instance using the conjugated polymers referred to above, onto the substrate in a reel-to-reel process, which would reduce cost and allow the manufacture of curved-surface devices. However, the disadvantage of the use of polymeric materials is their lower chemical resistance and inferior barrier properties. Nevertheless, various barrier coatings have been developed to minimise this problem. These coatings are typically applied in a sputtering process at elevated temperatures. A barrier layer may be organic or inorganic, should exhibit good affinity for the layer deposited thereupon, and be capable of forming a smooth surface. Materials which are suitable for use to form a barrier layer are disclosed, for instance, in U.S. Pat. No. 6,198,217. In order to ensure the integrity of the barrier layer and to prevent "pin-pricks" therein, the surface of the polymeric substrate must exhibit good smoothness.

It is now possible to produce electronic display devices comprising barrier-coated polymeric materials which have greater flexibility and improved impact resistance, and are of lighter weight than glass or quartz sheets of equal thickness. However, some polymeric substrates undergo unacceptable dimensional distortion, such as curl, when subjected to the processing conditions, particularly elevated temperature, during the manufacture of display devices. It is desirable to provide polymeric substrates which exhibit good high-temperature dimensional stability during the high temperature techniques (such as sputtering) used to deposit the barrier layer. One such class of polymeric substrates is disclosed in the present Applicant's co-pending International Patent Application PCT/GB2002/04112.

In addition, the surface smoothness of a polymeric substrate is often inferior to conventional glass substrates. As noted above, surface smoothness is critical in order to ensure the integrity of the subsequently applied barrier and conductive coatings, and to avoid pin-pricks.

It is an object of this invention to provide a coated polymeric film substrate which overcomes at least one of the aforementioned problems. In particular, it is an object of this invention to provide a coated polymeric film substrate having improved surface smoothness, particularly wherein said substrate is suitable for use as a substrate, particularly a flexible substrate, in the manufacture of an electronic or opto-electronic device comprising a conjugated conductive polymer, including an EL device (particularly an OLED), a photovoltaic cell and semiconductor devices (such as organic field effect transistors, thin film transistors and integrated circuits generally). It is a further object to provide a polymeric film having improved surface smoothness, good high-temperature dimensional stability and high optical clarity.

As used herein, a device containing a conjugated conductive polymer preferably refers to an EL device (particularly an OLED), a photovoltaic cell and semiconductor devices (such as organic field effect transistors, thin film transistors and integrated circuits generally). As used herein, an opto-electronic device containing a conjugated conductive polymer preferably refers to an EL device (particularly an OLED) and a photovoltaic device, and particularly an EL device (particularly an OLED). As used herein, the term electronic device containing a conjugated conductive polymer excludes opto-electronic devices and preferably refers to semiconductor devices such as organic field effect transistors, thin film transistors and integrated circuits generally, and particularly organic field effect transistors.

According to the present invention, there is provided the use of a composition comprising:
(a) from about 5 to about 50 weight percent solids, the solids comprising from about 10 to about 70 weight percent silica and from about 90 to about 30 weight percent of a partially polymerized organic silanol of the general formula RSi(OH)$_3$, wherein R is selected from methyl and up to about 40% of a group selected from the group consisting of vinyl, phenyl, gamma-glycidoxypropyl, and gamma-methacryloxypropyl, and
(b) from about 95 to about 50 weight percent solvent, the solvent comprising from about 10 to about 90 weight percent water and from about 90 to about 10 weight percent lower aliphatic alcohol, wherein the coating composition has a pH of from about 3.0 to about 8.0, preferably from about 3.0 to about 6.5, for the purpose of improving the surface smoothness of a polymeric substrate when applied thereto, particularly wherein said use is in the manufacture of an electronic or opto-electronic device containing a conjugated conductive polymer which comprises said polymeric substrate, and particularly wherein said device is an electroluminescent display device, particularly an OLED device.

Preferably, the pH of the coating composition is less than 6.2, preferably about 6.0 or less. Preferably, the pH of the coating composition is at least 3.5, preferably at least 4.0. In one embodiment, the pH of the coating composition is in the range of from about 4.0 to about 5.0, preferably from about 4.1 to about 4.8, preferably from about 4.3 to about 4.5. The pH of the coating solution can be adjusted according to techniques well known to those skilled in the art, including the addition of an acidic or basic solution. For example, suitable acids for the adjustment of the pH include hydrochloric and acetic acids, and suitable bases include sodium hydroxide.

The silica component of the coating compositions may be obtained, for example, by the hydrolysis of tetraethyl orthosilicate to form polysilicic acid. The hydrolysis can be carried out using conventional procedures, for example, by the addition of an aliphatic alcohol and an acid. Alternatively, the silica used in the instant coating compositions can be colloidal silica. The colloidal silica should generally have a particle size of about from 5-25 nm, and preferably about from 7-15 nm. Typical colloidal silicas which can be used in the instant invention include those commercially available as "Ludox SM", "Ludox HS-30" and "Ludox LS" dispersions (Grace Davison).

The organic silanol component has the general formula $RSi(OH)_3$. At least about 60% of the R groups, and preferably about from 80% to 100% of these groups, are methyl. Up to about 40% of the R groups can be higher alkyl or aryl selected from vinyl, phenyl, gamma-glycidoxypropyl, and gamma-methacryloxypropyl.

The combined solids of the coating composition, comprising the silica and the partially polymerized organic silanol, make up about from 5 to 50 weight percent of the total coating composition. Of these solids, the silica should comprise about from 10 to 70 weight percent, and preferably about from 20 to 60 weight percent, the complementary remainder comprising the organic siloxanol. Weight percents of the organic siloxanol herein are calculated as $RSiO_{1.5}$.

The solvent component of the coating compositions generally comprises a mixture of water and one or more lower aliphatic alcohols. The water generally comprises about from 10 to 90 weight percent of the solvent, while the lower aliphatic alcohol complementarily comprises about from 90 to 10 weight percent. The aliphatic alcohols generally are those having from 1 to 4 carbon atoms, such as methanol, ethanol, n-propanol, iso-propanol, n-butanol, sec-butanol and tertiary butanol.

In addition to the basic solvent components of water and alcohol, the solvent portion of the compositions can further comprise up to about 10 weight percent of a compatible polar solvent such as acetone, ethylene glycol monoethylether, ethylene glycol monobutylether and diethylene glycol monoethylether.

Still further components which can be present in the coating compositions include curing catalysts. These are preferably present in a concentration of about from 0.01% to 0.1% based on the total weight of the composition, and especially about from 0.01 to 0.3 weight percent. Curing catalysts which may be used in the coating compositions can vary widely. Representative catalysts include the alkali metal salts of carboxylic acids such as sodium acetate, potassium acetate, sodium formate, and potassium formate. Other representative curing catalysts which can be used include the quaternary ammonium carboxylates, such as benzyltrimethylammonium acetate.

Other suitable coating compositions are disclosed in U.S. Pats. No. 5,069,942 and 5,415,942, the disclosures of which are incorporated herein by reference. The compositions disclosed therein have a reduced alkali metal cation content (alkali metals had been used to stabilise silica hydrosols) and exhibit, inter alia, improved adhesion to a polymeric substrate.

The compositions can be prepared by wide variety of techniques, depending on the particular starting materials used. For example, organotrialkoxysilane can be hydrolyzed in the presence of prehydrolyzed polysilicic acid. Alternatively, organotrialkoxysilane can be prehydrolyzed and then added to a solution of polysilicic acid, often resulting in particularly rapid cure times. Still another alternative in the preparation of these compositions is the cohydrolysis of organotrialkoxysilane and tetraethyl orthosilicate together.

If a colloidal silica is used as the silica source in the coating compositions, the organic silanol can be combined with the silica either through the prehydrolysis of the organotrialkoxysilane or by hydrolyzing the organotrialkoxysilane in the presence of acidified colloidal silica dispersion. Still other methods of preparing and combining the components required for the compositions will be evident to those skilled in the handling of the individual components.

The coating compositions can be applied using conventional coating techniques, including continuous as well as dip coating procedures. The coatings are generally applied at a dry thickness of from about 1 to about 20 microns, preferably from about 2 to 10 microns, and particularly from about 3 to about 10 microns. The coating composition can be applied either "off-line" as a process step distinct from the film manufacture, or "in-line" as a continuation of the film manufacturing process. In order to improve the surface smoothness of the coated film, it is desirable to avoid contamination from dust-particles and the like, and so the coating is preferably conducted off-line in a dust-free environment.

The coating compositions, after application to the substrate, can be cured at a temperature of from about 20 to about 200° C., preferably from about 20 to about 150° C. While ambient temperatures of 20° C. require cure times of several days, elevated temperatures of 150° C. will cure the coatings in several seconds.

In a preferred embodiment, the substrate is a polyester film, such as poly(ethylene terephthalate) (PET) or poly(ethylene naphthalate) (PEN), preferably PEN. In a particularly preferred embodiment, the substrate is one described in International Patent Application PCT/GB2002/04112, and the disclosure therein of such substrates is incorporated herein by reference. Thus, the substrate is preferably a heat-stabilised, heat-set oriented film comprising poly(ethylene naphthalate). Preferably, said substrate has a coefficient of linear thermal expansion (CLTE) within the temperature range from −40° C. to +100° C. of less than $40 \times 10^{-6}$/° C., preferably less than $30 \times 10^{-6}$/° C., more preferably less than $25 \times 10^{-6}$/° C., more preferably less than $20 \times 10^{-6}$/° C. Preferably, said substrate has a shrinkage at 30 mins at 230° C., measured as defined herein, of less than 1%, preferably less than 0.75%, preferably less than 0.5%, preferably less than 0.25%, and more preferably less than 0.1%. Preferably, said substrate has a residual dimensional change $\Delta L_r$ measured at 25° C. before and after heating the film from 8° C. to 200° C. and then cooling to 8° C., of less than 0.75%, preferably less than 0.5%, preferably less than 0.25%, and more preferably less than 0.1%, of the original dimension. In a particularly preferred embodiment, the substrate is a heat-stabilised, heat-set oriented film comprising poly(ethylene naphthalate) having the afore-mentioned shrinkage characteristics after 30 min at 230° C., and preferably having the afore-mentioned residual dimensional change $\Delta L_r$ characteristics. The preferred substrates and their preparation are described in more detail below.

The substrate is self-supporting by which is meant capable of independent existence in the absence of a supporting base. The thickness of the substrate is preferably between about 12 and 300 μm, more preferably between about 25 and 250 μm, more preferably between about 50 and 250 μm.

PEN polyester can be synthesised by conventional methods. A typical process involves a direct esterification or ester exchange reaction, followed by polycondensation. Thus, PEN polyester may be obtained by condensing 2,5-, 2,6- or 2,7-naphthalenedicarboxylic acid, preferably 2,6-naphthalenedicarboxylic acid, or a lower alkyl (up to 6 carbon atoms) diester thereof, with ethylene glycol. Typically, polycondensation includes a solid phase polymerisation stage. The solid phase polymerisation may be carried out on a fluidised bed, e.g. fluidised with nitrogen, or on a vacuum fluidised bed, using a rotary vacuum drier. Suitable solid phase polymerisation techniques are disclosed in, for example, EP-A-0419400 the disclosure of which is incorporated herein by reference.

In one embodiment, the PEN is prepared using germanium catalysts which provide a polymeric material having a reduced level of contaminants such as catalyst residues, undesirable inorganic deposits and other byproducts of the polymer manufacture. The "cleaner" polymeric composition promotes improved optical clarity and surface smoothness.

The PEN used to prepare the substrate suitably has a PET-equivalent intrinsic viscosity (IV; measured as described herein) of 0.5-1.5, preferably 0.7-1.5, and in particular 0.79-1.0. An IV of less than 0.5 results in a polymeric film lacking desired properties such as mechanical properties whereas an IV of greater than 1.5 is difficult to achieve and would likely lead to processing difficulties of the raw material.

Formation of the substrate may be effected by conventional techniques well-known in the art. Conveniently, formation of the substrate is effected by extrusion, in accordance with the procedure described below. In general terms the process comprises the steps of extruding a layer of molten polymer, quenching the extrudate and orienting the quenched extrudate in at least one direction.

The substrate may be uniaxially-oriented, but is preferably biaxially-oriented. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties.

In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation.

In the preferred flat film process, the substrate-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Alternatively, orientation may be generated in the extruded film by way of simultaneous stretching. Here, the film is stretched in the longitudinal and transverse directions in what is essentially the same stage of the process, in the stenter oven. For both routes of sequential and simultaneous stretching, the extent of stretching is determined partly by the nature of the polyester. However the film is usually stretched so that the dimension of the oriented film is from 2 to 5, more preferably 2.5 to 4.5 times its original dimension in each direction of stretching. Typically, stretching is effected at temperatures in the range of 70 to 150° C., typically 70 to 140° C. Greater draw ratios (for example, up to about 8 times) may be used if orientation in only one direction is required. It is desired to obtain a film having balanced properties, which may be achieved for example controlling the stretching conditions in the machine and transverse directions.

The stretched film is dimensionally stabilised by heat-setting under dimensional restraint at a temperature above the glass transition temperature of the polyester but below the melting temperature thereof, to induce crystallisation of the polyester, as described in GB-A-838708. The tension of dimensional restraint is generally in the range of about 19 to about 75 kg/m, preferably about 45 to about 50 kg/m of film width which, for a film having a width of about 2.6 m is a tension in the range of about 50 to about 190 kg, preferably in the range of 120-130 kg. The actual heat-set temperature and time will vary depending on the composition of the film but should be selected so as not to substantially degrade the tear resistant properties of the film. Within these constraints, a heat-set temperature of about 135° to 250° C. is generally desirable, more preferably 235-240° C. The duration of heating will depend on the temperature used but is typically in the range of 5 to 40 secs, preferably 8 to 30 secs.

The film is then further heat-stabilised by heating it under low tension (i.e. with the minimum possible dimensional restraint) at a temperature above the glass transition temperature of the polyester but below the melting point thereof, in order to allow the majority of the inherent shrinkage in the film to occur (relax out) and thereby produce a film with very low residual shrinkage and consequently high dimensional stability. The tension experienced by the film during this heat-stabilisation step is typically less than 5 kg/m, preferably less than 3.5 kg/m, more preferably in the range of from 1 to about 2.5 kg/m, and typically in the range of 1.5 to 2 kg/m of film width. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135° C. to 250° C. is generally desirable, preferably 190 to 250° C., more preferably 200 to 230° C., and more preferably at least 215° C., typically 215 to 230° C. The duration of heating will depend on the temperature used but is typically in the range of 10 to 40 sec, with a duration of 20 to 30 secs being preferred. This heat stabilisation process can be carried out by a variety of methods, including flat and vertical configurations and either "off-line" as a separate process step or "in-line" as a continuation of the film manufacturing process. In one embodiment, heat stabilisation is conducted "off-line".

The substrate may comprise one or more discrete layers. The composition of the respective layers may be the same or different. For instance, the substrate may comprise one, two, three, four or five or more layers and typical multi-layer structures may be of the AB, ABA, ABC, ABAB, ABABA or ABCBA type. Preferably, the substrate comprises only one layer. Where the substrate comprises more than one layer, preparation of the substrate is conveniently effected by coextrusion, lamination or casting, in accordance with conventional techniques well-known in the art.

The substrate may conveniently contain any of the additives conventionally employed in the manufacture of polymeric films. Thus, agents such as cross-linking agents, dyes, pigments, voiding agents, lubricants, anti-oxidants, radical scavengers, UV absorbers, thermal stabilisers, flame retardants, anti-blocking agents, surface active agents, slip aids, optical brighteners, gloss improvers, prodegradents, viscosity modifiers and dispersion stabilisers may be incorporated as appropriate. The components of the substrate may be mixed together in a conventional manner.

In a preferred embodiment, the film described herein is optically clear, preferably having a % of scattered visible light (haze) of <3.5%, preferably <2%, more preferably <1.5%, more preferably $\leq$1%, and particularly less than 0.7%, measured according to the standard ASTM D 1003. In one embodiment, the haze is in the range of 0.6 to 1.0%. Preferably the total light transmission (TLT) in the range of 400-800 nm is at least 75%, preferably at least 80%, and more preferably at least 85%, measured according to the standard ASTM D 1003. In this embodiment, filler is typically present in only small amounts, generally not exceeding 0.5% and preferably less than 0.2% by weight of a given layer.

In an alternative embodiment, the substrate is opaque and highly filled, preferably exhibiting a Transmission Optical Density (TOD) (Sakura Densitometer; type PDA 65; transmission mode) in the range from 0.1 to 2.0, more preferably 0.2 to 1.5, more preferably from 0.25 to 1.25, more preferably from 0.35 to 0.75 and particularly 0.45 to 0.65. The film is conveniently rendered opaque by incorporation into the polymer blend of an effective amount of an opacifying agent. Suitable opacifying agents include an incompatible resin filler, a particulate inorganic filler or a mixture of two or more such fillers. Preferred particulate inorganic fillers include titanium dioxide and silica. Suitable incompatible resins include polyamides and olefin polymers, particularly a homo- or copolymer of a mono-alpha-olefin containing up to 6 carbon atoms in its molecule. The amount of filler present in a given layer is preferably in the range from 1% to 30%, more preferably 3% to 20%, particularly 4% to 15%, and especially 5% to 10% by weight, based on the weight of the layer polymer.

Prior to coating the substrate, it may be desirable to pretreat the substrate to promote adhesion of the coating. Various adhesion promoting techniques known to those skilled in the art can be used, such as flame treating, corona discharge, and/or resin coating.

In a preferred embodiment, the substrate is coated with a primer layer to improve adhesion of the substrate to the planarising coating composition. The primer layer may be any suitable adhesion-promoting polymeric composition known in the art, including polyester and acrylic resins. The primer composition may also be a mixture of a polyester resin with an acrylic resin. Acrylic resins may optionally comprise oxazoline groups and polyalkylene oxide chains. The polymer(s) of the primer composition is/are preferably water-soluble or water-dispersible.

Polyester primer components include those obtained from the following dicarboxylic acids and diols. Suitable di-acids include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, a dimer acid, and 5-sodium sulfoisophthalic acid. A copolyester using two or more dicarboxylic acid components is preferred. The polyester may optionally contain a minor amount of an unsaturated di-acid component such as maleic acid or itaconic acid or a small amount of a hydroxycarboxylic acid component such as p-hydroxybenzoic acid. Suitable diols include ethylene glycol, 1,4-butanediol, diethylene glycol, dipropylene glycol, 1,6-hexanediol, 1,4-cyclohexanedimethylol, xylene glycol, dimethylolpropane, poly(ethylene oxide) glycol, and poly(tetramethylene oxide) glycol. The glass transition point of the polyester is preferably 40 to 100° C., further preferably 60 to 80° C. Suitable polyesters include copolyesters of PET or PEN with relatively minor amounts of one or more other dicarboxylic acid comonomers, particularly aromatic di-acids such as isophthalic acid and sodium sulphoisophthalic acid, and optionally relatively minor amounts of one or more glycols other than ethylene glycol, such as diethylene glycol.

In one embodiment, the primer layer comprises an acrylate or methacrylate polymer resin. The acrylic resin may comprise one or more other comonomers. Suitable comonomers include alkyl acrylates, alkyl methacrylates (where the alkyl group is preferably methyl, ethyl, n-propyl, isopropyl, n-butyl, isobutyl, t-butyl, 2-ethylhexyl, cyclohexyl or the like); hydroxy-containing monomers such as 2-hydroxyethyl acrylate, 2-hydroxyethyl methacrylate, 2-hydroxypropyl acrylate, and 2-hydroxypropyl methacrylate; epoxy group-containing monomers such as glycidyl acrylate, glycidyl methacrylate, and allyl glycidyl ether; carboxyl group or its salt-containing monomers, such as acrylic acid, methacrylic acid, itaconic acid, maleic acid, fumaric acid, crotonic acid, styrenesulfonic acid and their salts (sodium salt, potassium salt, ammonium salt, quaternary amine salt or the like); amide group-containing monomers such as acrylamide, methacrylamide, an N-alkylacrylamide, an N-alkylmethacrylamide, an N,N-dialkylacrylamide, an N,N-dialkyl methacrylate (where the alkyl group is preferably selected from those described above), an N-alkoxyacrylamide, an N-alkoxymethacrylamide, an N,N-dialkoxyacrylamide, an N,N-dialkoxymethacrylamide (the alkoxy group is preferably methoxy, ethoxy, butoxy, isobutoxy or the like), acryloylmorpholine, N-methylolacrylamide, N-methylolmethacrylamide, N-phenylacrylamide, and N-phenylmethacrylamide; acid anhydrides such as maleic anhydride and itaconic anhydride; vinyl isocyanate, allyl isocyanate, styrene, α-methylstyrene, vinyl methyl ether, vinyl ethyl ether, a vinyltrialkoxysilane, a monoalkyl maleate, a monoalkyl fumarate, a monoalkyl itaconate, acrylonitrile, methacrylonitrile, vinylidene chloride, ethylene, propylene, vinyl chloride, vinyl acetate, and butadiene. In a preferred embodiment, the acrylic resin is copolymerised with one or more monomer(s) containing oxazoline groups and polyalkylene oxide chains.

The oxazoline group-containing monomer includes 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, and 2-isopropenyl-5-methyl-2-oxazoline. One or more comonomers may be used. 2-Isopropenyl-2-oxazoline is preferred.

The polyalkylene oxide chain-containing monomer includes a monomer obtained by adding a polyalkylene oxide to the ester portion of acrylic acid or methacrylic acid. The polyalkylene oxide chain includes polymethylene oxide, polyethylene oxide, polypropylene oxide, and polybutylene oxide. It is preferable that the repeating units of the polyalkylene oxide chain are 3 to 100.

Where the primer composition comprises a mixture of polyester and acrylic components, particularly an acrylic resin comprising oxazoline groups and polyalkylene oxide chains, it is preferable that the content of the polyester is 5 to 95% by weight, preferably 50 to 90% by weight, and the content of the acrylic resin is 5 to 90% by weight, preferably 10 to 50% by weight.

Other suitable acrylic resins include:
(i) a copolymer of (a) 35 to 40 mole % alkyl acrylate, (b) 35 to 40% alkyl methacrylate, (c) 10 to 15 mole % of a comonomer containing a free carboxyl group such as itaconic acid, and (d) 15 to 20 mole % of an aromatic sulphonic acid and/or salt thereof such as p-styrene sulphonic acid, an example of which is a copolymer comprising ethyl acrylate/methyl methacrylate/itaconic acid/p-styrene sulphonic acid and/or a salt thereof in a ratio of 37.5/37.5/10/15 mole %, as disclosed in EP-A-0429179 the disclosure of which is incorporated herein by reference; and
(ii) an acrylic and/or methacrylic polymeric resin, an example of which is a polymer comprising about 35 to 60 mole % ethyl acrylate, about 30 to 55 mole % methyl methacrylate and about 2 to 20 mole % methacrylamide, as disclosed in EP-A-0408197 the disclosure of which is incorporated herein by reference.

The primer or adherent layer may also comprise a cross-linking agent which improves adhesion to the substrate and should also be capable of internal cross-linking. Suitable cross-linking agents include optionally alkoxylated condensation products of melamine with formaldehyde. The primer or adherent layer may also comprise a cross-linking catalyst, such as ammonium sulphate, to facilitate the cross-linking of the cross-linking agent. Other suitable cross-linking agents and catalysts are disclosed in EP-A-0429179, the disclosures of which are incorporated herein by reference.

The primer coating may also contain a minor amount of one or more types of filler particles in order to assist in the handling of the film, particularly wherein the planarising coating composition is coated off-line. In one embodiment, the filler may comprise silica, and/or composite inorganic particles of silica with titania. The average particle diameter of the fine particles is preferably ranged from 40 to 120 nm. The primer coating should not be detrimental to the optical qualities of the substrate as described herein.

The primer layer may optionally contain an aliphatic wax to improve the handling and slip properties of the film surface. The content of the aliphatic wax is preferably at least 0.5% by weight in order to obtain the improvement, and preferably is 0.5 to 30%, further preferably 1 to 10% by weight. It is undesirable that the content exceeds 30% by weight, because the adhesion of the primer layer to the polyester film substrate and the subsequently-applied layer may deteriorate. Suitable aliphatic wax include vegetable waxes such as carnauba wax, candelilla wax, rice wax, Japan tallow, jojoba oil, palm wax, rosin-modified wax, ouricury wax, sugarcane wax, esparto wax, and bark wax; animal waxes such as beeswax, lanolin, spermaceti, insect wax, and shellac wax; mineral waxes such as montan wax, ozokerite, and ceresin wax; petroleum waxes such as paraffin wax, microcrystalline wax; and petrolatum, and synthetic hydrocarbon waxes such as Fischer-Tropsch wax, polyethylene wax, polyethylene oxide wax, polypropylene wax, and polypropylene oxide wax. Carnauba wax, paraffin wax and polyethylene wax are preferred. It is preferable to use the waxes as water dispersions.

The primer coating may also comprise an anti-static agent and/or a wetting agent, as known in the art.

A further suitable primer is disclosed in U.S. Pat. No. 3,443,950, the disclosure of which is incorporated herein by reference.

The coating of the primer layer onto the substrate may be performed in-line or off-line, but is preferably performed "in-line", and preferably between the forward and sideways stretches of a biaxial stretching operation.

Once the coating composition has been coated onto the substrate, the coated substrate is then ready for further processing and coating in preparation for its end-use. In the manufacture of the electronic and opto-electronic devices mentioned herein, the film is then coated with a barrier layer, as noted above. Such coatings are known in the art and are typically applied in a sputtering process at elevated temperatures. Materials which are suitable for use to form a barrier layer are disclosed, for instance, in U.S. Pat. No. 6,198,217. An organic barrier layer may be formed from, for instance, photocurable monomers or oligomers, or thermoplastic resins. Photocurable monomers or oligomers should have low volatility and high melting points. Examples of such monomers include trimethylol acrylates such as trimethylolpropane triacrylate, ditrimethylolpropane tetraacrylate and the like; long-chain acrylates such as 1,6-hexanediol diacrylate, 1,6-hexanediol dimethacrylate and the like; and cyclohexyl acrylates such as dicyclopentenyloxyethyl acrylate, dicyclopentenyloxy acrylate, cyclohexyl methacrylate and the like. Examples of such oligomers include acrylate oligomers, epoxy acrylate oligomers, urethane acrylate oligomers, ether acrylate oligomers, and the like. Photoinitiators, such as benzoin ethers, benzophenones, acetophenones, ketals and the like, may be used to cure the resin. Examples of suitable thermoplastic resins include polyethylene, polymethyl methacrylate, polyethylene terephthalate and the like. These organic materials may be applied by any conventional technique known in the art, such as by vacuum deposition. An inorganic barrier layer should be made of a material which exhibits low moisture permeability and is stable against moisture. Examples include oxides such as $SiO_2$, $SiO$, $GeO$, $Al_2O_3$ and the like, nitrides such as $TiN$, $Si_3N_4$ and the like, and metals such as Al, Ag, Au, Pt, Ni and the like. The inorganic material may be applied using a vapour phase technique such as vacuum deposition, sputtering and the like under standard conditions. A barrier layer can itself comprise one or more discrete layers, and may comprise one or more organic layer(s) and one or more inorganic layer(s).

In a preferred embodiment, the barrier layer is a layer which reduces the water vapour transmission rate of the substrate in an opto-electronic device to less than $10^{-6}$ $g/m^2/day$ and the oxygen transmission rate to less than $10^{-5}/mL/m^2/day$. In an alternative embodiment, the barrier layer is a layer which reduces the water vapour transmission rate of the substrate in an electronic device to less than $10^{-2}$ $g/m^2/day$ (preferably less than $10^{-6}$ $g/m^2/day$) and the oxygen transmission rate to less than $10^{-3}/mL/m^2/day$ (preferably less than $10^{-5}/mL/m^2/day$).

Once the barrier layer has been deposited, subsequent layers, including the electrode and conductive conjugated polymer, may be applied in accordance with conventional manufacturing techniques known in the art. The electrode may be any suitable electrode known in the art, for instance an electrode selected from those mentioned herein. In one embodiment, the electrode is a conductive metal oxide, preferably indium tin oxide.

The electronic and opto-electronic devices referred to generally herein comprise one (or more) layers of conductive conjugated polymer, two or more electrodes, and one or more substrate layers.

In one embodiment of the invention, the term electroluminescent display device, particularly an organic light emitting display (OLED) device, refers to a display device comprising a layer of light-emitting conductive conjugated polymeric material disposed between two layers each of which comprises an electrode, wherein the resultant composite structure is disposed between two substrate (or support or cover) layers.

In one embodiment of the invention, the term photovoltaic cell refers to a device comprising a layer of conductive conjugated polymeric material disposed between two layers each of which comprises an electrode, wherein the resultant composite structure is disposed between two substrate (or support or cover) layers.

In one embodiment of the invention, the term transistor refers to a device comprising at least one layer of conductive conjugated polymer, a gate electrode, a source electrode and a drain electrode, and one or more substrate layers.

According to a further aspect of the invention, there is provided a composite film comprising a substrate, preferably a heat-stabilised, heat-set, oriented polyester substrate, and a coating layer, wherein the coating layer is derived from the coating composition described herein, and wherein the surface of said coated substrate exhibits an Ra value, as measured herein, of less than 0.7 nm, preferably less than 0.6 nm, preferably less than 0.5 nm, preferably less than 0.4 nm, preferably less than 0.3 nm, and ideally less than 0.25 nm, and/or an Rq value, as measured herein, of less than 0.9 nm, preferably less than 0.8 nm, preferably less than 0.75 nm, preferably less than 0.65 nm, preferably less than 0.6 nm, preferably less than 0.50 nm, preferably 0.45 nm or lower, preferably less than 0.35 nm, and ideally less than 0.3 nm.

According to a further aspect of the invention there is provided a composite film comprising a heat-stabilised, heat-set, oriented substrate comprising poly(ethylene naphthalate), and a coating layer; preferably wherein said substrate has one or more of (i) the afore-mentioned coefficient of linear thermal expansion (CLTE) characteristics, and/or (ii) the afore-mentioned shrinkage characteristics, and/or (iii) the afore-mentioned residual dimensional change $\Delta L_r$ characteristics; and wherein said coating is sufficient to improve the surface smoothness of said substrate such that the Ra value and/or the Rq value satisfy the thresholds described hereinabove. In a preferred embodiment of this aspect of the invention, the coating comprises a polysiloxane derived from a coating composition comprising:

(a) about from 5 to 50 weight percent solids, the solids comprising about from 10 to 70 weight percent silica and about from 90 to 30 weight percent of a partially polymerized organic silanol of the general formula $RSi(OH)_3$, wherein R is selected from methyl and up to about 40% of a group selected from the group consisting of vinyl, phenyl, gamma-glycidoxypropyl, and gamma-methacryloxypropyl, and (b) about from 95 to 50 weight percent solvent, the solvent comprising about from 10 to 90 weight percent water and about from 90 to 10 weight percent lower aliphatic alcohol, wherein the coating composition has a pH of about from 3.0 to 8.0.

In one embodiment, said coated substrate comprises said substrate layer, and on both surfaces thereof said coating layer. A symmetrical film of this type is particularly useful in providing a dimensionally stable film in which film curl during subsequent processing is minimised or avoided.

In one embodiment, said coated substrate is one which is obtainable by the method described hereinbelow.

According to a further aspect of the present invention, there is provided a composite film comprising a substrate layer as described herein and on a surface thereof a planarising coating layer as described herein and on a surface of the coating layer a barrier layer as described herein, and optionally further comprising an electrode layer on at least part of the surface of the barrier layer, and optionally further comprising a layer of conjugated conductive polymer. In one embodiment, the composite film comprises said substrate layer, and on both surfaces thereof said planarising coating layer, and on both surfaces of said coated substrate a barrier layer.

According to a further aspect of the invention there is provided a method of manufacture of a coated polymeric film which comprises the steps of:

(i) forming a layer comprising poly(ethylene naphthalate);
(ii) stretching the layer in at least one direction;
(iii) heat-setting under dimensional restraint at a tension in the range of about 19 to about 75 kg/m, preferably about 45 to about 50 kg/m of film width, at a temperature above the glass transition temperature of the polyester but below the melting temperature thereof;
(iv) heat-stabilising under low tension, preferably at a tension of less than 5 kg/m, more preferably at a tension of less than 3.5 kg/m, more preferably at a tension in the range of 1.0 to 2.5 kg/m, and typically at a tension in the range of 1.5 to 2.0 kg/m of film width, and at a temperature above the glass transition temperature of the polyester but below the melting temperature thereof; and
(v) applying a planarising coating composition thereto preferably such that the Ra value and/or Rq value satisfy the thresholds described hereinabove.

According to a further aspect of the present invention, there is provided a method for the manufacture of an electronic or opto-electronic device containing a conjugated conductive polymer and a substrate as described herein, said method comprising the steps of:

forming a layer comprising poly(ethylene naphthalate);
(ii) stretching the layer in at least one direction;
(iii) heat-setting under dimensional restraint at a tension in the range of about 19 to about 75 kg/m, preferably about 45 to about 50 kg/m of film width, at a temperature above the glass transition temperature of the polyester but below the melting temperature thereof;
(iv) heat-stabilising under low tension, preferably at a tension of less than 5 kg/m, more preferably at a tension of less than 3.5 kg/m, more preferably at a tension in the range of 1.0 to 2.5 kg/m, and typically at a tension in the range of 1.5 to 2.0 kg/m of film width, and at a temperature above the glass transition temperature of the polyester but below the melting temperature thereof;
(v) applying a planarising coating composition thereto preferably such that the Ra value and/or Rq value satisfy the thresholds described hereinabove; and
(vi) providing the coated, heat-stabilised, heat-set, oriented film as a substrate in the device.

Steps in the manufacture of the electronic or opto-electronic device may further comprise providing on a surface of the coated substrate a barrier layer; providing an electrode by applying a conductive material onto at least part of the barrier layer; and providing a layer of a conductive conjugated polymer.

As used herein, the term "planarising coating composition" refers to a polymeric coating composition which increases the surface smoothness of a substrate when applied thereto, preferably such that the surface smoothness is improved such that the Ra value, as measured herein, is less than 0.7 nm, preferably less than 0.6 nm, preferably less than 0.5 nm, preferably less than 0.4 nm, preferably less than 0.3 nm, and ideally less than 0.25 nm, and preferably such that the Rq value, as measured herein, is less than 0.9 nm, preferably less than 0.8 nm, preferably less than 0.75 nm, preferably less than 0.65 nm, preferably less than 0.6 nm, preferably less than 0.50 nm, preferably 0.45 nm or lower, preferably less than 0.35 nm, and ideally less than 0.3 nm. In a preferred embodiment, the planarising coating composition comprises a polysiloxane derived from a composition comprising:

(a) about from 5 to 50 weight percent solids, the solids comprising about from 10 to 70 weight percent silica and about from 90 to 30 weight percent of a partially polymerized organic silanol of the general formula $RSi(OH)_3$, wherein R is selected from methyl and up to about 40% of a group selected from the group consisting of vinyl, phenyl, gamma-glycidoxypropyl, and gamma-methacryloxypropyl, and (b) about from 95 to 50 weight percent solvent, the solvent comprising about from 10 to 90 weight percent water and about from 90 to 10 weight percent lower aliphatic alcohol, wherein the coating composition has a pH of about from 3.0 to 8.0.

According to a further aspect of the invention, there is provided the use of a planarising coating composition in the manufacture of an electronic or opto-electronic containing a conjugated conductive polymer and which comprises a polymeric substrate, for the purpose of improving the surface smoothness of said polymeric substrate.

The following test methods may be used to determine certain properties of the polymeric film:

(i) the clarity of the film may be evaluated by measuring total luminance transmission (TLT) and haze (% of scattered transmitted visible light) through the total thickness of the film using a Gardner XL 211 hazemeter in accordance with ASTM D-1003-61.

(ii) Transmission Optical Density (TOD) of the film may be measured using a Macbeth Densitometer TR 927 (Dent & Woods Ltd, Basingstoke, UK) in transmission mode.

(iii) Dimensional stability may be assessed in terms of either
  (a) the coefficient of linear thermal expansion (CLTE) or
  (b) a temperature cycling method wherein the residual change in length along a given axis is measured after heating the film to a given temperature and subsequently cooling the film.

Both methods of measurements were conducted using a Thermomechanical Analyser PE-TMA-7 (Perkin Elmer) calibrated and checked in accordance with known procedures for temperature, displacement, force, eigendeformation, baseline and furnace temperature alignment. The films were examined using extension analysis clamps. The baseline required for the extension clamps was obtained using a very low coefficient of expansion specimen (quartz) and the CLTE precision and accuracy (dependent on post-scan baseline subtraction) was assessed using a standard material, e.g. pure aluminium foil, for which the CLTE value is well known. The specimens, selected from known axes of orientation within the original film samples, were mounted in the system using a clamp separation of approx. 12 mm and subjected to an applied force of 75 mN over a 5 mm width. The applied force was adjusted for changes in film thickness, i.e. to ensure consistent tension, and the film was not curved along the axis of analysis. Specimen lengths were normalised to the length measured at a temperature of 23° C.

In the CLTE test method (a), specimens were cooled to 8° C., stabilised, then heated at 5° C./min from 8° C. to +240° C. The CLTE values ($\alpha$) were derived from the formula:

$$\alpha = \Delta L / (L \times (T_2 - T_1))$$

where $\Delta L$ is the measured change in length of the specimen over the temperature range ($T_2 - T_i$), and L is the original specimen length at 23° C. CLTE values are considered reliable up to the temperature of the Tg (120° C.).

The data can be plotted as a function of the % change in specimen length with temperature, normalised to 23° C.

In the temperature cycling test method (b), a procedure similar to that of method (a) was used wherein the temperature was cycled between 8° C. and several elevated temperatures. Thus, film samples were heated from 8° C. to 140° C., 160° C., 180° C. or 200° C. and then cooled to 8° C. The length along each of the transverse and machine directions was measured at 25° C. before and after this heat treatment and the change in length $\Delta L_r$ calculated as percentage of the original length.

(iv) Intrinsic Viscosity (IV)

The IV was measured by melt viscometry, using the following procedure. The rate of flow pre-dried extrudate through a calibrated die at known temperature and pressure is measured by a transducer which is linked to a computer. The computer programme calculates melt viscosity values ($\log_{10}$ viscosity) and equivalent IVs from a regression equation determined experimentally. A plot of the IV against time in minutes is made by the computer and the degradation rate is calculated. An extrapolation of the graph to zero time gives the initial IV and equivalent melt viscosity. The die orifice diameter is 0.020 inches, with a melt temperature of 284° C. for IV up to 0.80, and 295° C. for IV>0.80.

(v) Shrinkage

Shrinkage at a given temperature is measured by placing the sample in a heated oven for a given period of time. The % shrinkage is calculated as the % change of dimension of the film in a given direction before and after heating.

(vi) Surface Smoothness

Surface smoothness was measured using conventional non-contacting, white-light, phase-shifting interferometry techniques, which are well-known in the art. The instrument used was a Wyko NT3300 surface profiler using a light source of wavelength 604 nm. With reference to the WYKO Surface Profiler Technical Reference Manual (Veeco Process Metrology, Arizona, US; June 1998; the disclosure of which is incorporated herein by reference), the characterising data obtainable using the technique include:

Averaging Parameter—Roughness Average (Ra): the arithmetic average of the absolute values of the measured height deviations within the evaluation area and measured from the mean surface.

Averaging Parameter—Root Mean Square Roughness (Rq): the root mean square average of the measured height deviations within the evaluation area and measured from the mean surface.

Extreme Value Parameter—Maximum Profile Peak Height (Rp) the height of the highest peak in the evaluation area, as measured from the mean surface.

Averaged Extreme Value Parameter—Average Maximum Profile Peak Height (Rpm): the arithmetic average value of the ten highest peaks in the evaluation area.

Extreme Peak Height Distribution: a number distribution of the values of Rp of height greater than 200 nm.

Surface Area Index: a measure of the relative flatness of a surface.

The roughness parameters and peak heights are measured relative to the average level of the sample surface area, or "mean surface", in accordance with conventional techniques. (A polymeric film surface may not be perfectly flat, and often has gentle undulations across its surface. The mean surface is a plane that runs centrally through undulations and surface height departures, dividing the profile such that there are equal volumes above and below the mean surface.)

The surface profile analysis is conducted by scanning discrete regions of the film surface within the "field of view" of the surface profiler instrument, which is the area scanned in a single measurement. A film sample may be analysed using a discrete field of view, or by scanning successive fields of view to form an array. The analyses conducted herein utilised the full resolution of the Wyko NT3300 surface profiler, in which each field of view comprises 480×736 pixels.

For the measurement of Ra and Rq, the resolution was enhanced using an objective lens having a 50-times magnification. The resultant field of view has dimensions of 90 µm×120 µm, with a pixel size of 0.163 µm.

For the measurement of Rp and Rpm, the field of view is conveniently increased using an objective lens having a 10-times magnification in combination with a "0.5-times field of view of multiplier" to give a total magnification of 5-times. The resultant field of view has dimensions of 0.9 mm×1.2 mm, with a pixel size of 1.63 µm. Preferably Rp is less than 100 nm, more preferably less than 60 nm, more preferably less than 50 nm, more preferably less than 40 nm, more preferably less than 30 nm, and more preferably less than 20 nm.

For the measurement of Ra and Rq herein, the results of five successive scans over the same portion of the surface area are combined to give an average value. The data presented below in respect of Rp are an average value from 100 measurements. The measurements were conducted using a modulation threshold (signal:noise ratio) of 10%, i.e. data points below the threshold are identified as bad data.

The surface topography can also be analysed for the presence of extreme peaks having a height of greater than 200 nm In this analysis, a series of measurements of Rp are taken with a pixel size of 1.63 µm over a total area of 5 cm². The results may be presented in the form of a histogram in which the data-points are assigned to pre-determined ranges of peak heights, for instance wherein the histogram has equally-spaced channels along the x-axis of channel width 25 nm. The histogram may be presented in the form of a graph of peak count (y axis) versus peak height (x axis); see for instance FIG. 1. The number of surface peaks in the range 300 to 600 nm per 5 cm² area, as determined from Rp values, may be calculated, and designated as N(300-600). The use of a planarising coating according to the present invention preferably results in a reduction of N(300-600), such that the reduction F, which is the ratio of N(300-600) before and after application of the planarising coating, is at least 5, preferably at least 15, and more preferably at least 30. Preferably, the N(300-600) value of the planarised film (after coating) is less than 50, preferably less than 35, preferably less than 20, preferably less than 10, and preferably less than 5 peaks per 5 cm² area.

The Surface Area Index is calculated from the "3-dimensional surface area" and the "lateral surface area" as follows. The "3-dimensional (3-D) surface area" of a sample area is the total exposed 3-D surface area including peaks and valleys. The "lateral surface area" is the surface area measured in the lateral direction. To calculate the 3-D surface area, four pixels with surface height are used to generate a pixel located in the centre with X, Y and Z dimensions. The four resultant triangular areas are then used to generate approximate cubic volume. This four-pixel window moves through the entire dataset. The lateral surface area is calculated by multiplying the number of pixels in the field of view by the XY size of each pixel. The surface area index is calculated by dividing the 3-D surface area by the lateral area, and is a measure of the relative flatness of a surface. An index which is very close to unity describes a very flat surface where the lateral (XY) area is very near the total 3-D area (XYZ).

A Peak-to-Valley value, referred to herein as "$PV_{95}$", may be obtained from the frequency distribution of positive and negative surface heights as a function of surface height referenced to the mean surface plane. The value $PV_{95}$ is the peak-to-valley height difference which envelops 95% of the peak-to-valley surface height data in the distribution curve by omitting the highest and lowest 2.5% of datapoints. The $PV_{95}$ parameter provides a statistically significant measure of the overall peak-to-valley spread of surface heights.

(vii) Oxygen transmission rate can be measured using ASTM D3985.
(viii) Water vapour transmission rate can be measured using ASTM F1249.

The invention is further illustrated by the following examples. It will be appreciated that the examples are for illustrative purposes only and are not intended to limit the invention as described above. Modification of detail may be made without departing from the scope of the invention.

EXAMPLES

Example 1

Dimethyl naphthalate was reacted with ethylene glycol in the presence of 400 ppm manganese acetate tetrahydrate catalyst to give bis-(2-hydroxyethyl) naphthalate and low oligomers thereof, in a standard ester interchange reaction. At the end of the ester interchange reaction 0.025% of phosphoric acid stabiliser was added, followed by 0.04% of antimony trioxide polycondensation catalyst. A standard batch polycondensation reaction was performed until the intrinsic viscosity (IV) of the polyethylene naphthalate (referred to herein as "Polyester A") was approximately 0.50-0.575 (true PEN IV; PET equivalent IV 0.75-0.85)

The polymer composition was then extruded and cast onto a hot rotating polished drum. The film was then fed to a forward draw unit where it was stretched over a series of temperature-controlled rollers in the direction of extrusion to approximately 3.34 times its original dimensions. The draw temperature was approximately 133° C. The film was then passed into a stenter oven at a temperature of 138° C. where the film was stretched in the sideways direction to approximately 4.0 times its original dimensions. The biaxially stretched film was then heat-set at temperatures up to about 238° C. by conventional means before being cooled and wound onto reels. The total film thickness was 125 µm.

The heat-set biaxially stretched film was then unwound and passed through a series of four flotation ovens and allowed to relax by applying the minimum line tension compatible with controlling the transport of the web. The heat-stabilised film was then wound up. Each of the four ovens had three controlled temperature zones in the transverse direction (left, centre and right):

|  | Left | Centre | Right |
|---|---|---|---|
| Oven 1 | 200 | 213 | 200 |
| Oven 2 | 200 | 213 | 200 |
| Oven 3 | 200 | 213 | 200 |
| Oven 4 | 195 | 213 | 195 |

The line speed of the film during the heat-stabilisation step was 15 m/min The tensions used for the film (1360 mm original roll width) were 24-25N.

Example 2

Dimethyl naphthalate was reacted with ethylene glycol (2.1:1 glycol:ester mole ratio) in the presence of 400 ppm manganese acetate catalyst to give bis-(2-hydroxyethyl) naphthalate and low oligomers thereof, in a standard ester interchange reaction. At the end of the ester interchange reaction 0.025% of phosphoric acid stabiliser was added, followed by 0.020% of germanium dioxide polycondensation catalyst (133 ppm Ge metal).

A standard batch polycondensation reaction was performed until the intrinsic viscosity (IV) of the polyethylene naphthalate (referred to herein as "Polyester B") was approximately 0.50-0.575 (true PEN IV; PET equivalent IV 0.75-0.85). A film was then produced in accordance with the procedure of Example 1.

Example 3

The film of Example 2 was coated, between the forwards and sideways stretches during film manufacture, with a first coating composition comprising
(i) an 18% solids aqueous dispersion of a copolymer of ethyl acrylate (EA; 48 mole %), methyl methacrylate (MMA; 48 mole %) and methacrylamide (MA; 4 mole %) (derived from AC201®; Rohm and Haas); 18 litres
(ii) SYNPERONIC NP10® (Uniqema; a nonyl phenol ethoxylated surfactant; 100 ml
(iii) 20% ammonium nitrate (20% aqueous solution); 300 ml
(iv) Distilled water; 81 litres.

The dry thickness of the primer coating was 30 nm
The film was then coated off-line with a second coating composition obtained as follows:
(i) 517 cm$^3$ of methyltrimethoxysilane (obtained from OSi Specialities) was added to 1034 cm$^3$ demineralised water at room temperature and stirred for 24 hours.
(ii) 54 cm$^3$ of 3-glycidoxypropyl trimethoxysilane (obtained from Aldrich Chemical Company) was added to 108 cm$^3$ of demineralised water at room temperature and stirred for 24 hours.
(iii) 53 cm$^3$ of 10% aqueous acetic acid (Aldrich Chemical Company) was added to 700 cm$^3$ of Ludox LS colloidal silica (12 nm). To this was added 162 cm$^3$ of the hydrolysed 3-glycidoxypropyl trimethoxysilane/water mixture and 1551 cm$^3$ of the hydrolysed methyltrimethoxysilane/water mixture. This mixture was stirred for 12 hours before coating. The final pH of the composition was 6.05. The thickness of the coating was 2.3±0.2 μm.

Example 4

The procedure of Example 3 was repeated, except that the second coating composition was applied to give a coat thickness of 4.6±0.2 μm
The surface roughness of the films of Examples 1 to 3 is shown in Table 1.

TABLE 1

| | Surface Roughness | | |
|---|---|---|---|
| | Ex. 1 | Ex. 2 | Ex. 3 |
| Ra (nm) | 0.64 | 0.63 | 0.58 |
| Rq (nm) | 0.90 | 0.82 | 0.74 |

The results in Table 1 show that a superior smoothness is obtained for Example 3.

The planarising effect is also illustrated by inspection of FIG. 1, which shows the number of extreme surface peaks greater than 200 nm. Curve (3) in FIG. 1 was obtained by analysis of Example 3 before application of the second coating composition. Curve (2) was obtained by analysis of Example 3 after application of the second coating composition. Curve (1) was obtained by analysis of Example 4. The N(300-600) values for the curves shown is FIG. 1 are 250, 31 and 8 for curve 3, curve 2 and curve 1, respectively. Thus, the reduction F is 8 for curve 2 and 31 for curve 1.

Example 5

Dimethyl naphthalate was reacted with ethylene glycol in the presence of 210 ppm manganese acetate tetrahydrate catalyst to give bis-(2-hydroxyethyl) naphthalate and low oligomers thereof, in a standard ester interchange reaction. At the end of the ester interchange reaction 0.025 wt % of phosphoric acid stabiliser was added, followed by 0.036 wt % of antimony trioxide polycondensation catalyst. A standard batch polycondensation reaction was performed.

The polymer composition was extruded and cast onto a hot rotating polished drum. The film was then fed to a forward draw unit where it was stretched over a series of temperature-controlled rollers in the direction of extrusion to approximately 3.1 times its original dimensions. The draw temperature was approximately 145° C. The film was then passed into a stenter oven at a temperature of 145° C. where the film was stretched in the sideways direction to approximately 3.5 times its original dimensions. The biaxially stretched film was then heat-set at temperatures up to about 240° C. by conventional means before being cooled and wound onto reels. The total film thickness was 125 μm. The film was then heat-stabilised as described for Example 1.

Example 6

The procedure of Example 5 was followed except that an aqueous primer coating composition was coated between the forward and sideways stretching steps onto the substrate to give a coat thickness of 50 nm. The primer coating had the following solids content:
(i) 67% of a copolyester emulsion (wherein the acidic components of the copolyester comprise 65 mol % of 2,6-naphthalenedicarboxylic acid, 30 mol % of isophthalic acid and 5 mol % of 5-sodium sulfoisophthalic acid, and the glycol components comprise 90 mol % of ethylene glycol and 10 mol % of diethylene glycol; Tg=80° C.; average molecular weight=13,000; produced in accordance with a method described in Example 1 of JP-A-116487/1994);
(ii) 20% of an aqueous dispersion of an acrylic resin (comprising 30 mol % of methyl methacrylate, 30 mol % of 2-isopropenyl-2-oxazoline, 10 mol % of polyethylene oxide (n=10) methacrylate and 30 mol % of acrylamide; Tg=50° C.; produced in accordance with a method described in Production Examples 1 to 3 of JP-A-37167/1988).
(iii) 3% inert particles (silica and $SiO_2$—$TiO_2$; average particle diameter in the range of 40 to 120 nm)
(iv) 5% carnauba wax
(v) 5% polyoxyethylene (n=7) lauryl ether

Example 7

The procedure of Example 6 was followed and then the film coated off-line with the planarising coating composition of Example 3. The thickness of the planarising coating was 2.8 μm±0.2 μm.

TABLE 2

| | Surface Roughness | | |
|---|---|---|---|
| | Ex. 5 | Ex. 6 | Ex. 7 |
| Ra (nm) | 0.70 | 1.77 | 0.47 |
| Rq (nm) | 1.11 | 2.98 | 0.62 |
| Peak:Valley value $PV_{95}$ (nm) | 3.47 | 8.75 | 2.28 |
| Surface Area Index | — | 1.000024 | 1.000003 |
| Rp (Standard deviation) | 68.1 (39.8) | 131.8 (20.7) | 17.7 (8.2) |

A comparison of the surface area index of Examples 6 and 7 indicate that the surface of Example 7 is about 8 times smoother than that of Example 6.

The invention claimed is:

1. A composite film comprising a heat-stabilised, heat-set, oriented poly(ethylene naphthalate) substrate, and a coating layer having a surface; wherein said substrate exhibits one or more of:
   (i) a shrinkage at 30 mins at 230° C. of less than 1%; and/or
   (ii) a residual dimensional change $\Delta L_r$ measured at 25° C. before and after heating the substrate from 8° C. to 200° C. and then cooling to 8° C., of less than 0.75% of the original dimension; and/or
   (iii) a coefficient of linear thermal expansion (CLTE) within the temperature range from −40° C. to +100° C. of less than $40\times10^{-6}$/° C.;
   and wherein the surface of said coating layer exhibits an Ra value of less than 0.6 nm, and/or an Rq value of less than 0.8 nm, the thickness of the substrate is between 50 and 250 μm and wherein the number of surface peaks in the range 300 to 600 nm per 5 cm² area (N(300-600)) of the film is less than 50.

2. The composite film of claim 1, wherein the coating layer comprises from about 10 to about 70 weight percent silica and from about 90 to about 30 weight percent of a partially polymerized organic silanol of the formula $RSi(OH)_3$, wherein R is selected from methyl and up to about 40% of the R groups are a group selected from the group consisting of vinyl, phenyl, gamma-glycidoxypropyl, and gamma-methacryloxypropyl.

3. The composite film of claim 1, wherein the substrate exhibits a shrinkage at 30 mins at 230° C. of less than 1%.

4. The composite film of claim 1, wherein the substrate exhibits a residual dimensional change $\Delta L_r$ measured at 25° C. before and after heating the substrate from 8° C. to 200° C. and then cooling to 8° C., of less than 0.75% of the original dimension.

5. The composite film of claim 1, wherein the substrate exhibits a coefficient of linear thermal expansion (CLTE) within the temperature range from −40° C. to +100° C. of less than $40\times10^{-6}$/° C.

6. The composite film of claim 1, wherein the substrate exhibits
   (i) a shrinkage at 30 mins at 230° C. of less than 1%; and
   (ii) a residual dimensional change $\Delta L_r$ measured at 25° C. before and after heating the substrate from 8° C. to 200° C. and then cooling to 8° C., of less than 0.75% of the original dimension.

7. The composite film of claim 1, wherein the substrate exhibits
   (ii) a residual dimensional change $\Delta L_r$ measured at 25° C. before and after heating the substrate from 8° C. to 200° C. and then cooling to 8° C., of less than 0.75% of the original dimension; and
   (iii) a coefficient of linear thermal expansion (CLTE) within the temperature range from −40° C. to +100° C. of less than $40\times10^{-6}$/° C.

8. The composite film of claim 1, wherein the substrate exhibits
   (i) a shrinkage at 30 mins at 230° C. of less than 1%; and
   (iii) a coefficient of linear thermal expansion (CLTE) within the temperature range from −40° C. to +100° C. of less than $40\times10^{-6}$/° C.

9. The composite film of claim 1, wherein the substrate exhibits
   (i) a shrinkage at 30 mins at 230° C. of less than 1%;
   (ii) a residual dimensional change $\Delta L_r$ measured at 25° C. before and after heating the substrate from 8° C. to 200° C. and then cooling to 8° C., of less than 0.75% of the original dimension; and
   (iii) a coefficient of linear thermal expansion (CLTE) within the temperature range from −40° C. to +100° C. of less than $40\times10^{6}$/° C.

10. The composite film according to claim 1 further comprising a barrier layer.

11. The composite film according to claim 10 which exhibits a water vapour transmission rate of less than $10^{-6}$ g/m²/day and/or an oxygen transmission rate of less than $10^{-5}$/mL/m²/day.

12. An electronic or opto-electronic device comprising the composite film of claim 1, said device further comprising a conjugated conductive polymer.

13. The electronic or opto-electronic device of claim 12, wherein the device is an electroluminescent display device.

14. The electronic or opto-electronic device of claim 12, wherein the device is an organic light emitting display (OLED) device.

15. The electronic or opto-electronic device of claim 12, wherein the device is a photovoltaic device.

* * * * *